United States Patent [19]

Nakano

[11] Patent Number: 5,633,633
[45] Date of Patent: May 27, 1997

[54] CODEC APPARATUS

[75] Inventor: Takahiko Nakano, Ikoma, Japan

[73] Assignee: Sharp Kabushiki Kaisha, Osaka, Japan

[21] Appl. No.: 245,861

[22] Filed: May 19, 1994

[30] Foreign Application Priority Data

Jul. 19, 1993 [JP] Japan .................. 5-177857

[51] Int. Cl.⁶ .................................. H03M 7/00
[52] U.S. Cl. .............................. 341/61; 341/122
[58] Field of Search ...................... 341/110, 122, 341/143, 61

[56] References Cited

U.S. PATENT DOCUMENTS 4,630,300 12/1986 Kang et al. .................. 381/31
4,755,795 7/1988 Page .......................... 341/122
4,855,743 8/1989 Hester ......................... 341/110
5,300,894 4/1994 Myer et al. ................... 330/129

FOREIGN PATENT DOCUMENTS 62-159198 7/1987 Japan .

*Primary Examiner*—Marc S. Hoff

[57] ABSTRACT

A codec apparatus is for converting an analog signal to a digital signal, and for decoding the digital signal to an analog signal. The codec apparatus includes a detection device for discriminating a frequency bandwidth of the analog signal, and a changing device for changing a sampling frequency of the digital signal based upon a signal from the detection device. The sampling frequency of a digital signal can be changed according to a frequency bandwidth of an analog signal. This arrangement can prevent the sampling frequency from being set excessively high.

36 Claims, 11 Drawing Sheets

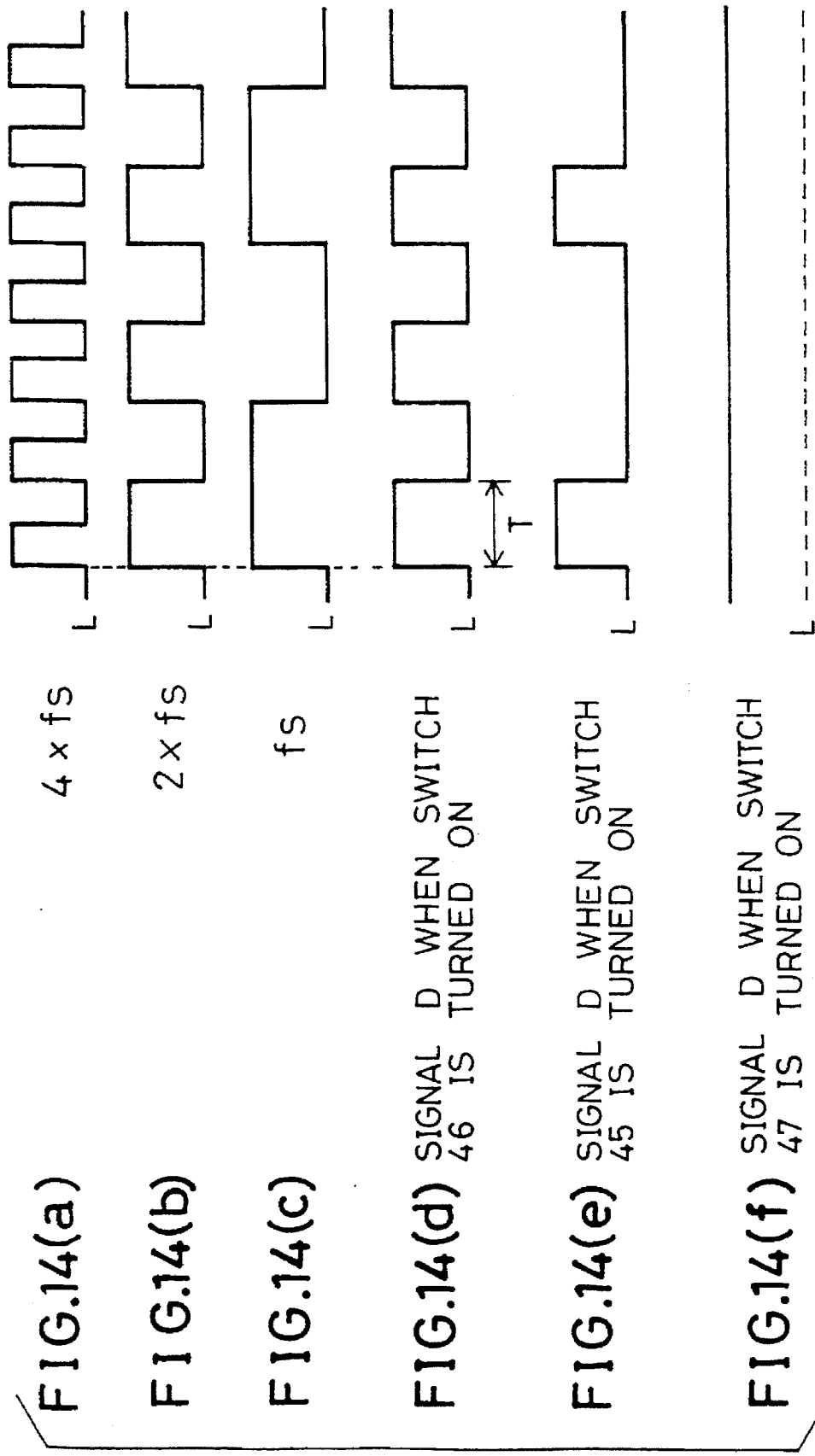

CODEC APPARATUS

FIELD OF THE INVENTION

The present invention relates to a codec apparatus (codec: a compound word of coder and decoder) which codes an audio signal maintaining good sound quality, and decodes the coded audio signal.

BACKGROUND OF THE INVENTION

In order to code an audio signal, a codec apparatus samples the audio signal at a predetermined sampling frequency (hereinafter, noted as Fs), and converts the audio signal to a digital signal. The audio signal is an electric signal in an audio frequency bandwidth.

The Fs is set to be greater than or equal to twice a frequency bandwidth of the audio signal in accordance with the Nyquist theorem which is generally well-known. In other words, the Fs is set according to the frequency bandwidth of the audio signal to be coded.

Here, the above-mentioned bandwidth represents an upper limit value in each frequency bandwidth of various audio signals because each lower limit value in the frequency bandwidth is sufficiently lower than the upper limit value of each frequency bandwidth.

In the case where a sound signal such as a voice is coded, an Fs of 8 kHz is generally used. The reason is that information of the sound signal can be accurately transmitted even when a signal having a frequency bandwidth of less than 4 kHz is used.

However, in a codec apparatus wherein the Fs is constant, the frequency bandwidth of the audio signal which can be coded is limited because it is determined in accordance with Fs. In a codec apparatus for sound wherein the Fs is 8 kHz, it is impossible to obtain sufficient sound quality when a music signal is coded and decoded. The reason is that a wider frequency bandwidth is required for a music signal.

On the contrary, when the Fs is set so as to maintain sound quality of music, the Fs is set higher than necessary for the sound signal. As the Fs becomes higher, an amount of information becomes greater in proportion to the Fs, thereby causing trouble in that a coding circuit having an excessive processing speed and a large storage capacity is required.

For that reason, a method for changing an Fs is disclosed in Japanese Laid-Open Patent Application No. 159198/1987 (Tokukaisho 62-159198). The arrangement disclosed in the publication is a technique for reproducing coded data having various Fs using one sound synthesizer. In order to decode and reproduce coded data using the above-mentioned arrangement, a sound signal or a music signal should be coded in accordance with each Fs, which has been predetermined according to each signal.

However, the above-mentioned troubles occur even with the arrangement in the aforementioned publication. Namely, with this arrangement, for example in the case where the sound signal is mixed with the music signal, the Fs is set high according to the music signal so as to maintain sound quality of the music signal.

For this reason, with the above arrangement, a storage region should be preliminarily set to have a large capacity so as to accommodate various signals and to maintain sound quality. Therefore, with this arrangement, there is a problem in that a portion of the preliminarily set storage region is very likely to go unused.

SUMMARY OF THE INVENTION

It is an object of the present invention to provide a codec apparatus capable of (i) converting an audio signal to a digital signal, (ii) decoding the digital signal to an analog signal, (iii) avoiding waste due to an excessively high Fs by changing an Fs of the digital signal according to a frequency bandwidth of the analog signal while maintaining sound quality of the audio signal.

In order to accomplish the above object, the codec apparatus of the present invention for converting an analog signal to a digital signal, and for decoding the digital signal to an analog signal comprises:

detection means for discriminating a frequency bandwidth of the analog signal; and changing means for changing an Fs of the digital signal based on the signal from the detection means.

With the above arrangement, the detection means discriminates the frequency bandwidth of the analog signal and outputs a signal which represents the bandwidth to the changing means. The changing means changes the sampling frequency Fs of the digital signal so as to, for example, correspond to twice the bandwidth. In other words, in the case where the bandwidth is narrow, the changing means sets the Fs lower. In the case where the bandwidth is wide, the changing means sets the Fs higher.

Therefore, with the above arrangement, since the Fs becomes twice the bandwidth, when a digital signal converted from the analog signal is decoded to an analog signal, the quality of the analog signal can always be maintained. Further, this arrangement prevents the Fs from being set excessively high.

In other words, for example, in the case where respective digital signals having various bands are coded so as to be stored in a memory, a storage region, which is very likely not to be fully used, does not have to be preliminarily secured (as previously described).

This reason will be described as follows. Generally, as the Fs of the digital signal becomes higher, the necessary storage region in the memory becomes large. Further, in order to maintain quality of the decoded analog signal, the Fs of the digital signal should be set so as to correspond to twice a frequency bandwidth of the inputted analog signal.

Therefore, in a conventional manner, in order to accommodate each signal in various band widths, the storage region in the memory is set according to a signal in the widest bandwidth, that is, a storage region which will not be fully used when the widest bandwidth is not received, is preliminarily secured (as previously described).

However, with the above arrangement, since the Fs of the digital signal is changed according to the frequency bandwidth of the analog signal to be inputted, the storage region does not have to be preliminarily secured (as previously described).

Therefore, this arrangement makes it possible to avoid using an excessively large storage region and to always maintain sound quality, and thus may have a more compact design.

Moreover, as an Fs increases, it takes more time to code a digital signal, but this arrangement can reduce the time it takes to code the digital signal.

For a more complete understanding of the nature and advantages of the invention, reference should be made to the ensuing detailed description taken in conjunction with the accompanying drawings.

BRIEF DESCRIPTION OF THE DRAWINGS

FIG. 6(a) shows that the signal is thinned to ¼; FIG. 6 (b) shows that the signal is thinned to ½; and FIG. 6(c) shows that the signal is not thinned.

FIGS. 14(a) through 14(f) are timing charts which show a synchronization between a clock signal and a signal D in the clock divider.

DESCRIPTION OF THE EMBODIMENTS

[EMBODIMENT 1]

Figure 1:
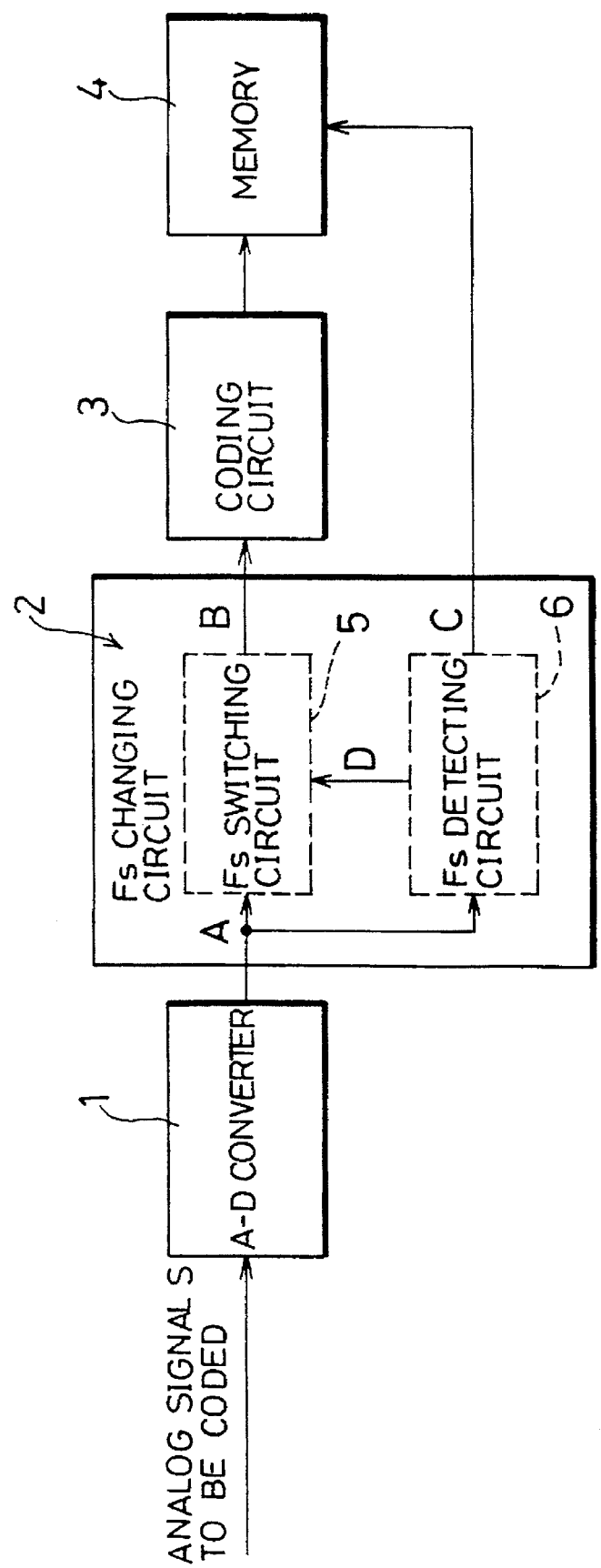
FIG. 1 is a block diagram which shows a main construction of a codec apparatus according to embodiment 1 of the present invention.

Referring to FIGS. 1 through 8, the following description will discuss one embodiment of the present invention as EMBODIMENT 1.

A codec apparatus has an A-D converter 1, a sampling frequency (hereinafter, noted as Fs), a changing circuit 2, a coding circuit 3 and a memory 4.

The A-D converter 1 converts an analog signal S to be coded to a digital signal per a predetermined number of bits in accordance with a predetermined first Fs, and outputs the digital signal A to the Fs changing circuit 2.

The first Fs is set based upon the widest frequency bandwidth of an analog signal which is used in the codec apparatus. For example, it can be set to correspond to twice the widest bandwidth.

The Fs changing circuit 2 has an Fs switching circuit (changing means) 5 and an Fs detection circuit (detection means) 6. The Fs detection circuit 6 discriminates the frequency bandwidth of the digital signal, and outputs a control signal D to the Fs switching circuit 5 based upon the detected frequency bandwidth.

The Fs switching circuit 5 outputs either a digital signal B which has been obtained by changing a first Fs of the inputted digital signal A to a second Fs, or the digital signal B still having the first Fs to the coding circuit 3 based upon the control signal D.

The coding circuit 3 performs a compressing process, etc. on the digital signal B from the Fs switching circuit 5, prepares coded data to be stored in the memory 4, and outputs the coded data.

The memory 4 is a magnetic storage medium such as a hard disc, or a random access memory, and has a storage region where the coded data are successively stored. In addition, a data signal C, which is outputted from the Fs detection circuit 6, is inputted and stored in the memory 4. The data signal C is data which discriminates the second Fs of the digital signal from the Fs switching circuit 5.

With the above arrangement, the Fs detection circuit 6 discriminates a frequency bandwidth of the analog signal S, and outputs the bandwidth to the Fs switching circuit 5 as the control signal D. The Fs switching circuit 5 changes the first Fs of the digital signal from the A-D converter 1 to the second Fs in accordance with the control signal D.

In other words, when the bandwidth is narrow, the second Fs is set low. In contrast, when the bandwidth is wide, the second Fs is set high. Further, when the bandwidth is widest, the first Fs is outputted as the second Fs.

Therefore, with this arrangement, it is possible to change the second Fs of the digital signal according to the frequency bandwidth of the analog signal so as to, for example, always becomes twice the bandwidth.

The digital signal B from the Fs switching circuit 5 is inputted to the coding circuit 3, and becomes coded data in the coding circuit 3. The coded data is inputted and stored to memory 4.

Therefore, since this arrangement always makes the second Fs of the digital signal correspond to twice the frequency bandwidth of the analog signal, it is possible to always maintain sound quality of the analog signal which has been decoded from the coded data stored in the memory 4.

Furthermore, this arrangement can prevent the second Fs from being set excessively high.

This reason will be described as follows. Generally, as an Fs of a digital signal becomes higher, the capacity of the storage region in the memory 4 becomes larger. And in order to maintain quality in the decoded analog signal, the Fs of the digital signal should be set so as to become twice the frequency bandwidth of the inputted analog signal.

Therefore, in the conventional manner, in order to accommodate each signal in various bands, a storage region in memory must be sized for a signal having the widest bandwidth. As a result, a portion of that storage region is very likely to go unused unless the widest bandwidth signal is received.

However, with the inventive arrangement, since the Fs of the digital signal is changed according to the frequency bandwidth of the analog signal S to be inputted, the storage region does not have to be preliminarily secured (as previously discussed).

Therefore, this arrangement not only always ensures sound quality, but also makes it possible to reduce the necessary size of the storage region in the memory 4. As a result, it is possible for memory 4 to have a compact design and to be efficiently utilized.

In addition, in the case where a digital signal is coded by the coding circuit 3, it takes more time to code the digital signal in proportion to a higher level of the Fs. Since this arrangement prevents an excessively high Fs, the time it takes to code the digital signal can be reduced. This improves the processing speed for coding the digital signal.

Next, the following description will more concretely discuss the arrangement that a first Fs is changed to a second Fs in the Fs changing circuit 2. The first Fs can be changed to the second Fs, which is used for coding, by thinning an output from the AD converter 1.

Figure 2:
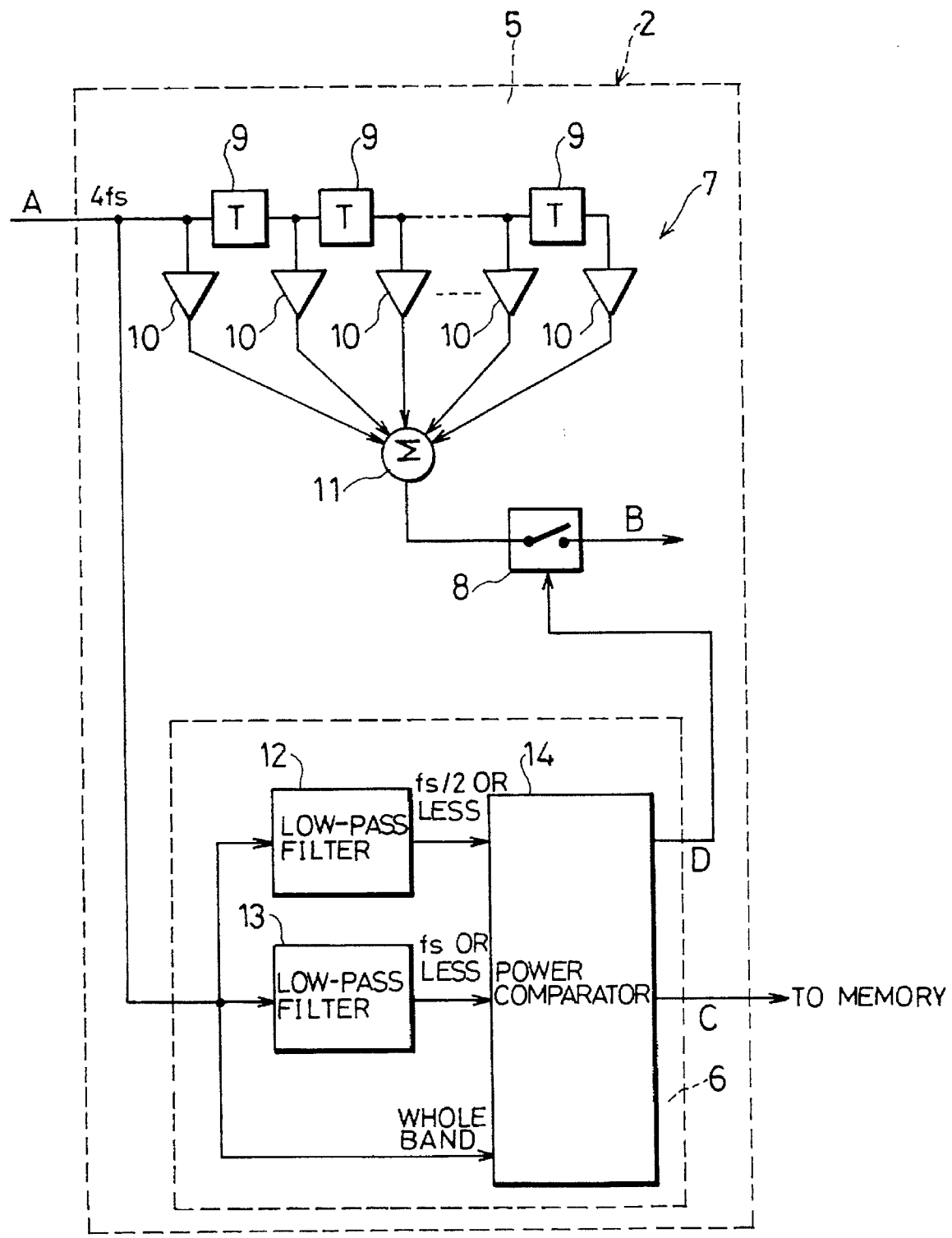
FIG. 2 is a drawing which shows a construction of an Fs changing circuit in the codec apparatus.

As shown in FIG. 2, the Fs changing circuit is provided with a filter 7 which eliminates aliasing noises due to the first Fs from the digital signal A, and a switch (switching means) 8 which thins the output from the filter 7 in a predetermined interval.

For example, an FIR (Finite Impulse Response) type filter is used as the filter 7. The filter 7 is a basic digital filter.

The filter 7 is provided with a plurality of delay units 9 . . . , a plurality of coefficient units 10 . . . and an adder 11. The respective delay units 9 . . . successively delay inputted signals. The respective coefficient units 10 . . . multiply the inputted signals from the respective delay units 9 . . . by coefficients and output the respective signals. The adder 11 adds signals from the respective coefficient units 10 . . . and outputs the added signal. In the filter 7, a desired filter characteristic can be obtained by respectively adjusting the coefficients of the coefficient units 10 . . . .

An AND gate, etc. is used as the switch 8. While maintaining the quality of the digital signal inputted to the Fs changing circuit 2, the filter 7 and the switch 8 change the first Fs of the digital signal A to the second Fs so as to output the digital signal B to the coding circuit 3.

Next, the following description will discuss an operation in the Fs changing circuit 2. First, if a digital signal from the AD converter 1 is inputted at a specified first Fs (here, $4 \times f_s$), an operating speed of the filter 7 become 4 times fs. At this time, the adder 11 also outputs the first Fs of ($4 \times f_s$).

The digital signal, which will be an output of the adder 11, is thinned out per a cycle of Ts and outputted, thereby changing the first Fs to a second Fs. Here, the cycle Ts is equal to $1/(4 \times f_s)$ which is the reciprocal of the frequency ($4 \times f_s$).

In other words, in the Fs changing circuit 2, after the digital signal is thinned out by the switch 8, the inputted digital signal A, whose first Fs has been changed to a second Fs, is outputted as the digital signal B.

Next, the following description will discuss in more detail the Fs detection circuit 6 which detects a frequency bandwidth of an analog signal S to be inputted so as to change the Fs of the digital signal inputted to the Fs changing circuit 2, according to the frequency bandwidth.

First, the Fs detection circuit 6 includes two low-pass filters (hereinafter, noted as LPF) 12 and 13 and a power comparator (comparison means) 14. In the LPF 12, a frequency component of, for example, less than $f_s/2$ is extracted from the digital signal A from the A-D converter 1, so as to be outputted. In the LPF 13, a frequency component of, for example, less than Fs is extracted from the digital signal A, so as to be outputted.

The outputs of the LPFs 12 and 13 and the digital signal A are respectively inputted in the power comparator 14, and the powers of the inputs are compared with one another so that the frequency bandwidth of the digital signal from the A-D converter 1 is detected. (The arrangement of the power comparator 14 will be mentioned later.) In this manner, the Fs detection circuit 6 detects the frequency bandwidth of the original analog signal.

In addition, the power comparator 14 outputs the control signal D, which controls the switch 8, to the switch 8 in accordance with the detected bandwidth, and outputs data which discriminate the Fs changed by the control signal D to the memory 4.

Figure 3:
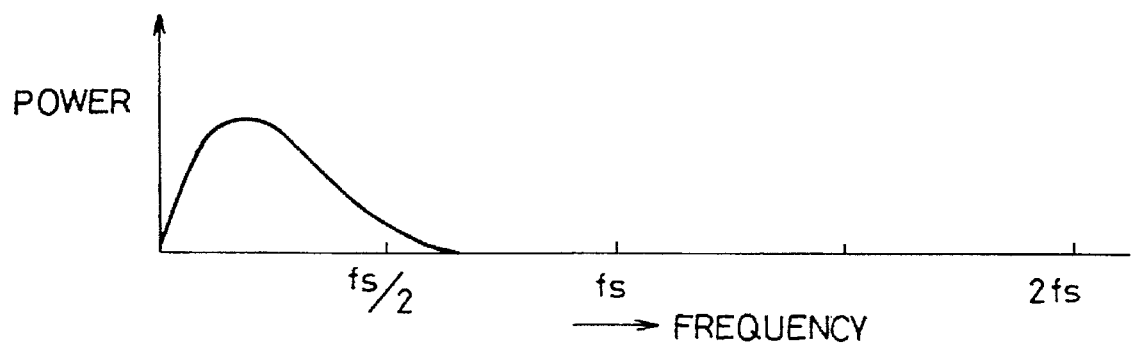
FIG. 3 is a graph which shows a frequency bandwidth of a signal to be inputted to the codec apparatus when the frequency bandwidth is mostly less than $f_s/2$.

In the Fs changing circuit 2, the Fs is controlled as follows. First, as shown in FIG. 3, in the case where an inputted digital signal is an ordinary sound signal whose frequency bandwidth is distributed in a low range, when a ratio of the frequency bandwidth of the digital signal is compared, the bandwidth becomes less than $f_s/2$.

In this case, as shown in FIG. 6(a), in the Fs changing circuit 2, the switch 8 is controlled by the Fs detection circuit 6, which has detected the bandwidth, so as to be turned ON ¼ time (turned ON during a period of Ts, and turned OFF during the remaining period of $3 \times T_s$).

Thereafter, the signal B is outputted at a second Fs which becomes $f_s$ by thinning an output from the filter 7 to ¼. Therefore, the second Fs becomes $f_s$, namely, becomes twice $f_s/2$ which is the frequency bandwidth of the original analog signal. As a result, the information of the analog signal can be accurately transmitted.

Figure 4:
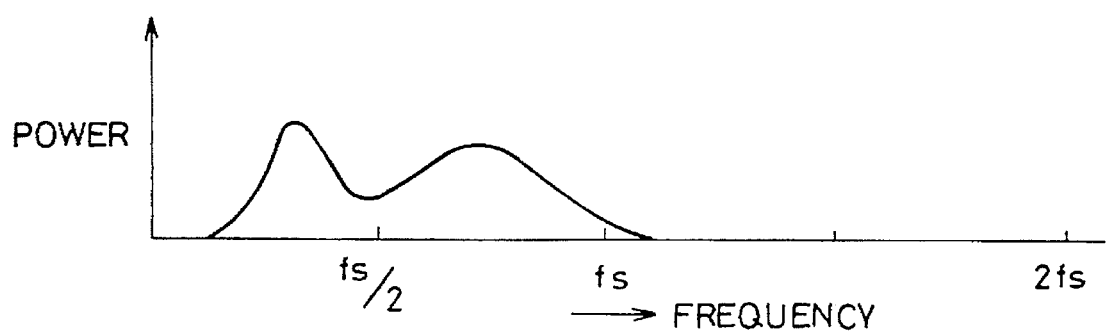
FIG. 4 is a graph which shows the frequency bandwidth of the signal to be inputted to the codec apparatus when the frequency bandwidth is mostly less than $f_s$.

Furthermore, as shown in FIG. 4, in the case where the signal is produced from, for example, simple melodical music having a frequency bandwidth up to a middle range, and the frequency bandwidth is less than $F_s$, as shown in FIG. 6(b), the switch 8 of FIG. 2 is controlled so as to be turned ON ½ time.

In other words, the switch 8 is controlled so as to be ON during a period of $T_s$, be OFF during the next period of $T_s$, be ON during the still next period of $T_s$, and be OFF during the still next period of $T_s$.

As a result, the output of the digital signal is thinned to ½, and the signal is outputted at a second Fs of ($2 \times f_s$). Since the second Fs becomes ($2 \times f_s$), that is, becomes twice $f_s$ which is equal to the frequency bandwidth of the original analog signal, the information of the analog signal can be accurately transmitted.

Figure 5:
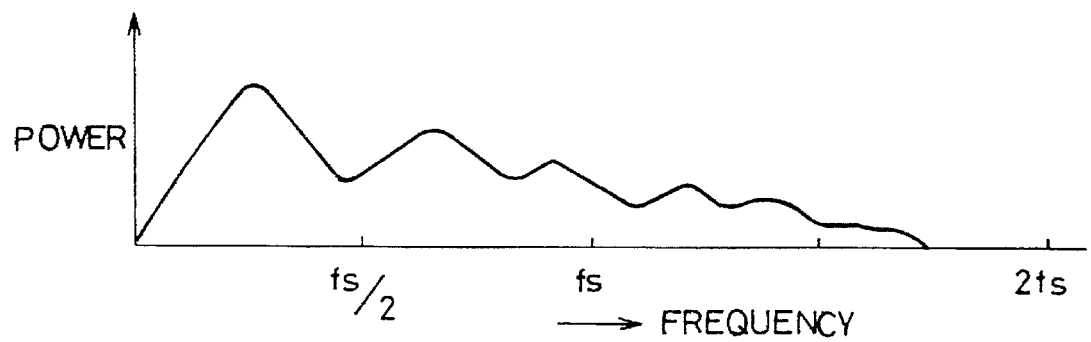
FIG. 5 is a graph which shows the frequency bandwidth of the signal to be inputted to the codec apparatus when the frequency bandwidth is in the proximity of $(2 \times f_s)$.
Figure 6:
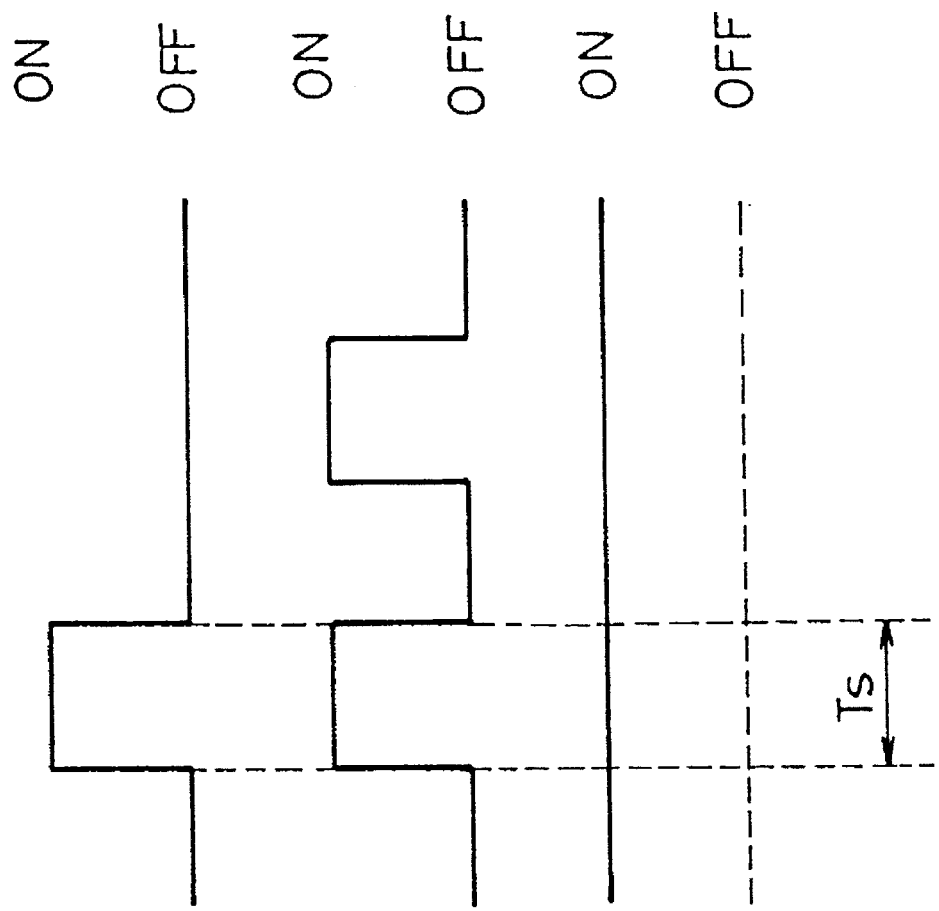
FIG. 6 is a timing chart when a signal is thinned in the Fs changing circuit.

Moreover, as shown in FIG. 5, if the signal is produced from, for example, normal music having a frequency bandwidth of up to a high range, and the frequency component is spread in the proximity of ($2 \times f_s$), as shown in FIG. 6(c), the switch 8 of FIG. 2 is controlled to be always turned ON.

As a result, the digital signal is outputted at a second Fs of ($4 \times f_s$) without thinning the output of the digital signal. Therefore, since the second Fs becomes ($4 \times f_s$), that is, twice the frequency bandwidth of the original analog signal, the information of the analog signal can be accurately transmitted.

Here, an ON/OFF control in the switch 8 is operated so as to synchronize with the first Fs of the digital signal inputted in the power comparator 14 as described later.

As mentioned above, with this arrangement, setting of the Fs changing circuit 2 makes it possible to avoid preliminarily setting a storage region (as previously described), as well as to make the memory 4 compact and efficient.

Furthermore, this arrangement reduces a delay of the coding speed in the coding circuit 3 which would occur with an excessively high Fs, thereby improving a processing speed at the time of coding the digital signal B.

Figure 7:
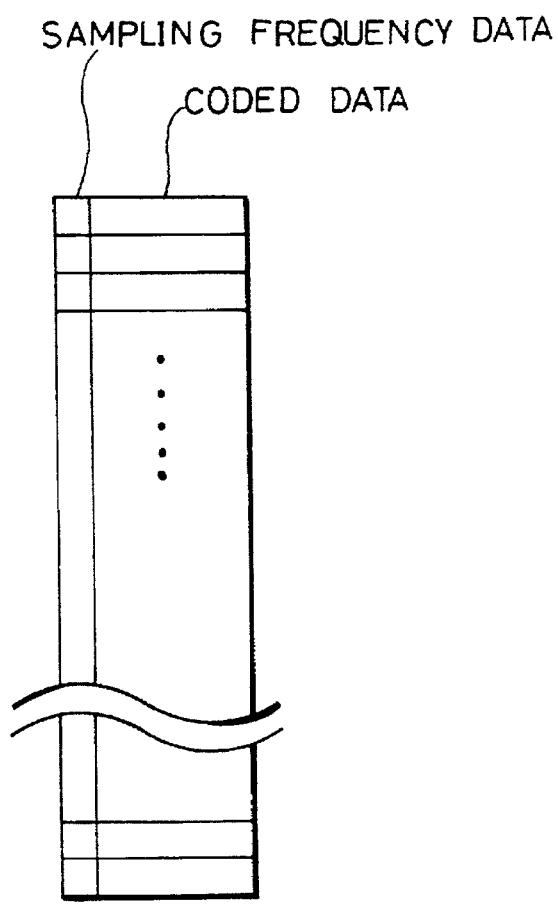
FIG. 7 is a drawing which explains one example of a storage region for storing coded data, and data which represent an Fs in the codec apparatus.
Figure 8:
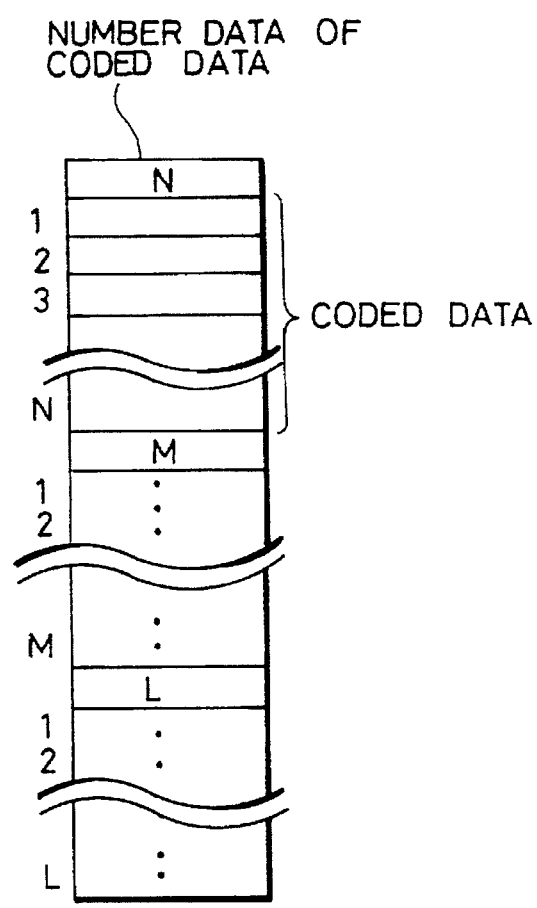
FIG. 8 is a drawing which explains another example of the storage region for storing the decoded data and the data which represent the Fs in the codec apparatus.

Here, with respect to the way to store data which discriminate a second Fs from the Fs switching circuit 5, storage data formats shown in FIGS. 7 and 8 are considered. Such data formats require reducing an amount of data which is added to coded data so as to provide an economical codec apparatus.

The data format which is shown in FIG. 7 is a method for adding Fs data (which represent an Fs) to a head section of coded data. This simple method can provide a simple circuit arrangement, but a data compression rate is lowered and economy of a memory is deteriorated because the Fs data are added to all coded data.

The data format shown in FIG. 8 is a method for adding number data which represent a number in the case where coded data having the same Fs continue. This method is effective when the Fs is not changed frequently.

At this time, in the above method, if the Fs has two variations, as shown in the drawing, only number data which represent a number of coded data which continue with the same Fs, and data which represent the Fs of the first coded data group, are stored.

However, if the Fs has three variations, not only the number data but also discrimination data for discriminating a kind of each Fs are added.

Here, in spite of storing the number data, the storing method is also adaptable for inserting delimiter data into a portion where the Fs is changed.

[EMBODIMENT 2]

Referring to FIGS. 7 through 11, the following description will discuss another embodiment of the present invention as embodiment 2. Here, those members of the present embodiment that have the same arrangement and function, and that are mentioned in the aforementioned embodiment, are indicated by the same reference numerals and description thereof is omitted.

Figure 9:
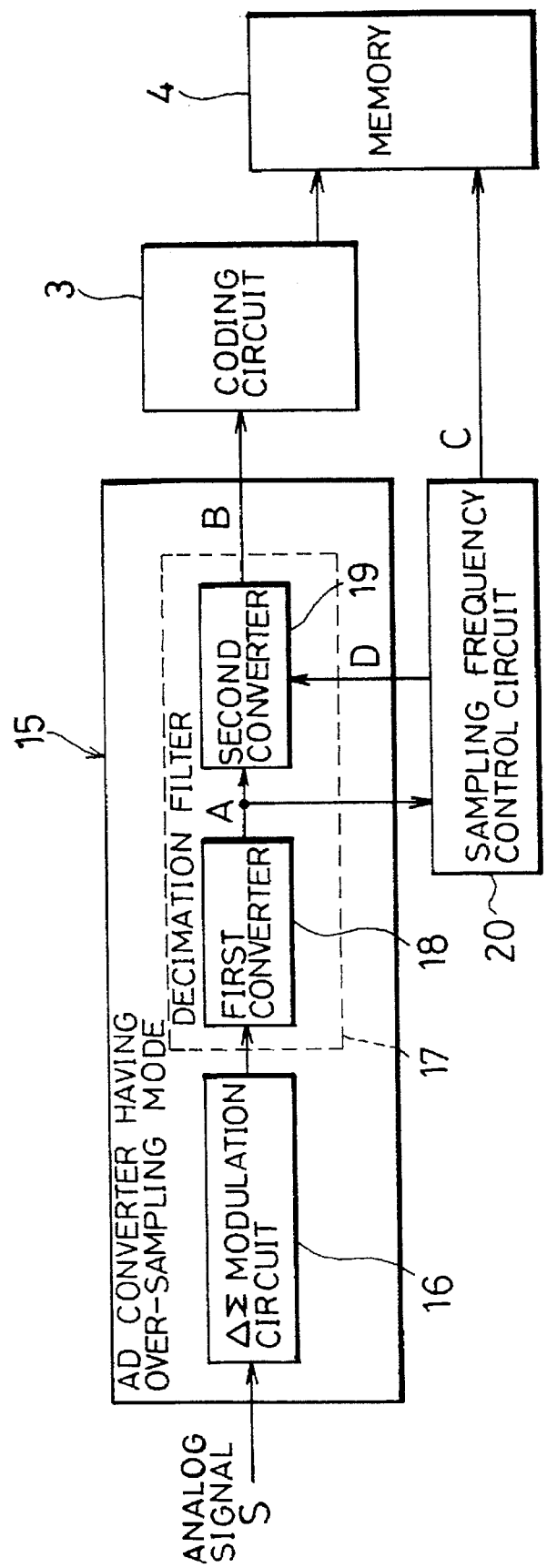
FIG. 9 is a block diagram which shows a main construction of a codec apparatus according to embodiment 2 of the present invention.

In a codec apparatus of embodiment 2, in spite of the A-D converter 1, as shown in FIG. 9, an A-D converter (conversion means) 15 having an over-sampling mode changes an Fs of a digital signal as described above.

The A-D converter 15 includes a $\Delta\Sigma$ modulation circuit 16 and a decimation filter 17. The decimation filter 17 has a function of converting a higher Fs to a predetermined lower Fs.

Therefore, the A-D converter 15 can change an Fs without separately providing the Fs changing circuit 2 which is shown in FIG. 1.

An over-sampling frequency of the A-D converter 15 is set according to a purpose of a signal which will be subject to an A-D conversion. Normally, the $\Delta\Sigma$ modulation circuit 16 operates in correspondence with a frequency several hundred times a target Fs, and in the A-D converter 15, it is necessary to change the frequency to a normal Fs which is one several hundredths of the frequency. Therefore, the decimation filter 17 includes a first converter 18 and a second converter 19.

Figure 10:
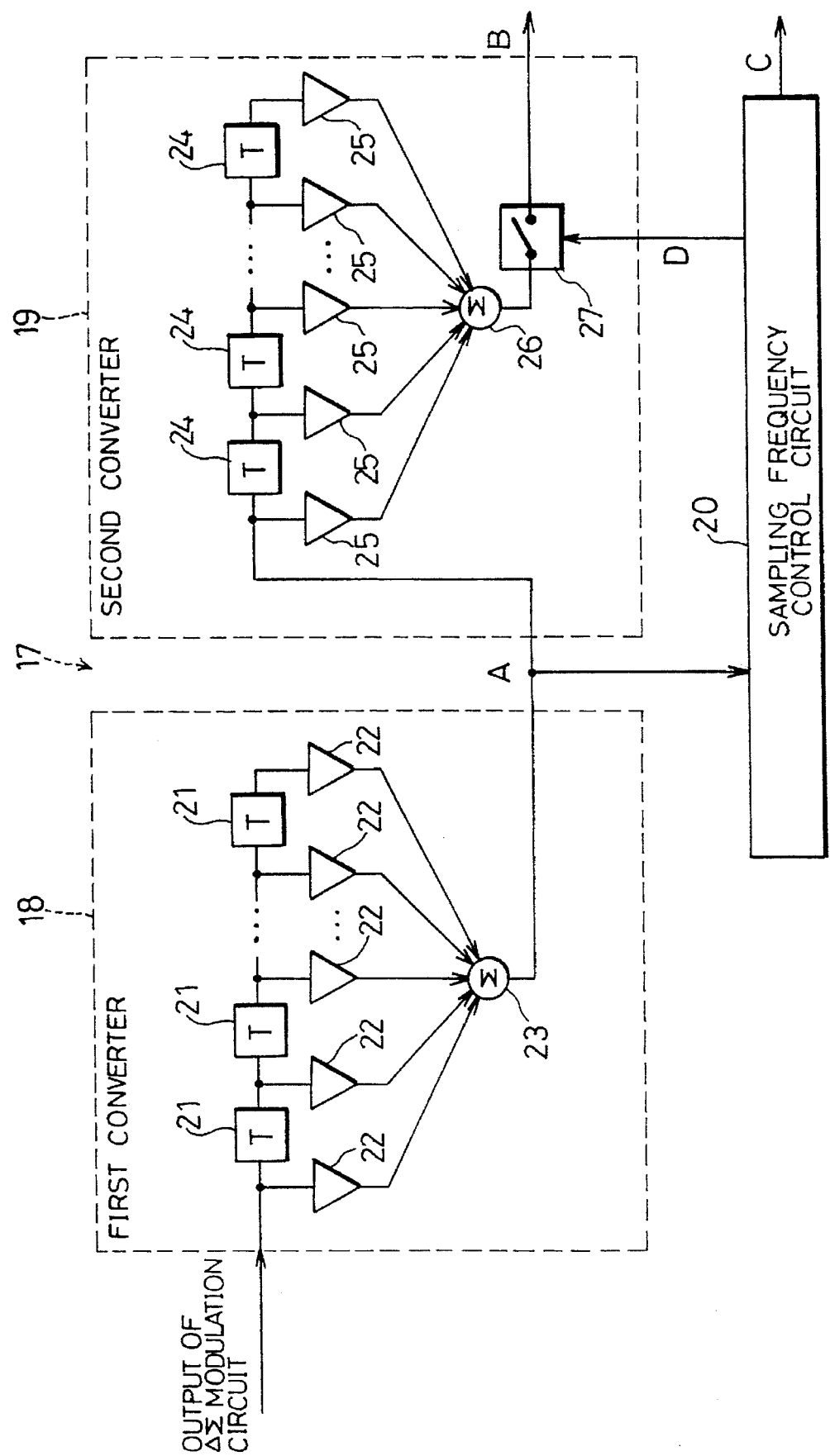
FIG. 10 is a drawing which explains a decimation filter and an Fs control circuit in the codec apparatus.

As shown in FIG. 10, the first converter 18 has a plurality of delay units 21 . . . , a plurality of coefficient units 22 . . . and an adder 23. In the delay units 21 . . . , output signals from the $\Delta\Sigma$ modulation circuit 16 are successively delayed per a cycle of $T_s$. In the coefficient units 22 . . . the output signals and the signals from the respective delay units 21 . . . are multiplied by coefficients. In the adder 23, the signals from the respective coefficient units 22 . . . are added to one another and outputted.

Similar to the first converter 18, the second converter 19 has a plurality of delay units 24 . . . and a plurality of coefficient units 25 . . . , an adder 26, and further, a switch (switching member) 27 which is similar to the aforementioned switch 8 and to which a signal is inputted.

In the first converter 18, an output signal from the $\Delta\Sigma$ modulation circuit 16 is received, and an Fs is changed so that it becomes several times that of a target Fs. Then the output signal is output to the second converter 19. Successively, the signal A, which has been converted in the aforementioned manner, is converted in the second converter 19 so as to have the target Fs. Then the signal A is output to the switch 27.

The codec apparatus is provided with an Fs control circuit (control means) 20 for controlling the switch 27. The Fs control circuit 20 observes an output from the first converter 18, detects a frequency bandwidth of the output, and controls an Fs of a digital signal output from the second converter 19 based upon the bandwidth.

Therefore, the Fs control circuit 20 is capable of changing an Fs of a digital signal B to be input to the coding circuit 3 according to the bandwidth, for example changing it so as to become twice the bandwidth. The digital signal B from the second converter 19 is supplied to the aforementioned coding circuit 3. An output from the coding circuit 3 is supplied to the memory 4.

Figure 11:
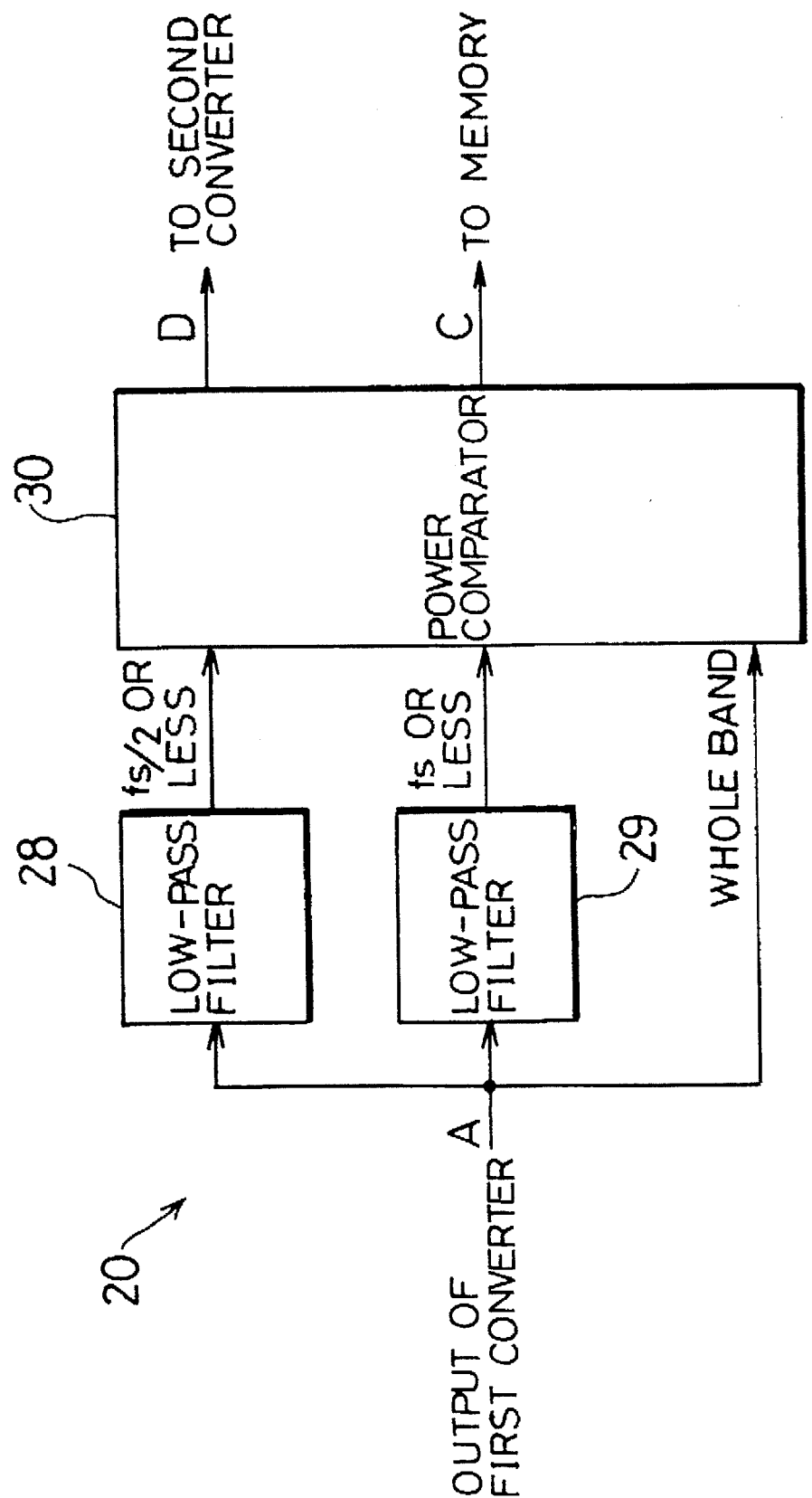
FIG. 11 is a block diagram which shows the Fs control circuit.

Next, the following description will discuss in more detail the Fs control circuit 20. For example, as shown in FIG. 11, the Fs control circuit 20 is provided with an LPF 28, an LPF 29 and a power comparator 30. Similar to the aforementioned LPF 12, the LPF 28 extracts a frequency bandwidth of the digital signal which is less than $f_s/2$. Similar to the aforementioned LPF 13, the LPF 29 extracts a frequency bandwidth of the digital signal which is less than fs.

The power comparator 30 is capable of detecting a frequency bandwidth in an output of the first converter 18 by comparing the respective outputs from the LPF 28 and the LPF 29, and an output from the first converter 18. A detailed arrangement of the power comparator 30 will be described later.

As mentioned above, a selection is made from, for example, $f_s$, $(2 \times f_s)$ and $(4 \times f_s)$ for an Fs based upon the detected bandwidth. For example, if the bandwidth is mostly less than $f_s/2$, then the Fs is set as $f_s$. If the bandwidth is mostly less than $f_s$, then the Fs is set as $(2 \times f_s)$.

In the Fs control circuit 20, when an optimum Fs is set by comparing the respective outputs with one another, a signal D is provided for controlling the Fs of the digital signal B of the second converter 19. Furthermore, the Fs control circuit 20 outputs a signal C for storing data, which discriminate a current Fs, to the memory 4 in the same manner as embodiment 1. The signal C is stored in the memory 4 in the same manner as embodiment 1 (see FIG. 7 or FIG. 8).

Here, if two kinds of Fs to be inputted to the coding circuit 3 exist, then there should be one LPF.

A signal for controlling the second converter 19, that is similar to the signal for controlling the switch 8 shown in FIG. 2, determines a thinning cycle. At this time, when coefficients of the respective coefficient units 22 . . . and 25 . . . are changed (if necessary), then a signal with less aliasing noise can be obtained.

As to a method for storing the current Fs to the memory 4, the method as described in embodiment 1 is used.

As mentioned in embodiment 2, in the case where the Fs is changed by using the decimation filter 17, accuracy of the signal can be obtained in the decimation filter 17 by converting an over-sampled signal to a predetermined sampling frequency. Therefore, the decimation filter 17 is designed to avoid deterioration in the accuracy of the signal due to a change in the output of the second converter 19.

The above-mentioned description discusses only a coding operation. The following description will discuss a decoding operation. With the arrangements of the respective embodiments, the Fs needed for decoding is definitely stored in the memory 4.

Therefore, for example, if an Fs of the DA converter is set according to the above-mentioned data, then data coded by using the present invention can be accurately decoded. In other words, the Fs of the DA converter is controlled according to data which represent the Fs stored in the memory 4, or data which represent a switching portion of the Fs.

With the arrangements of the respective embodiments, an Fs of an audio signal can be changed to an optimum Fs according to a frequency bandwidth of the original audio signal. As a result, when the audio signal is coded, it is possible to eliminate wasted memory (which occurs in the conventional situation with Fs set excessively high), without deteriorating sound quality of the audio signal.

As mentioned above, with the arrangement of embodiment 2, the memory 4 may have compact design may be efficiently utilized.

Furthermore, this arrangement avoids prolonged coding which would occur due to an excessive Fs, thereby improving the processing speed of a coded digital signal converted from the analog signal.

In addition, with the arrangements of the respective embodiments, a frequency bandwidth of a signal to be coded is always observed, and the Fs of the signal is changed in real time. Therefore, an operator can start a coding operation on an analog signal without considering the type and frequency bandwidth of analog signal to be coded, and can continue the coding operation on the analog signal even if the signal's type or frequency bandwidth changes. As a result, the optimal coding operation for the analog signal can be performed, saving the operator time.

Here, with the arrangement of the present embodiment, the description has discussed examples where coded data are stored in the memory 4. However, it is obvious that this arrangement is also adaptable to cases in which coded data are transmitted by other means such as optical fiber or radio.

Next, the following description will discuss power comparators 14 and 30 in detail. Since the power comparators 14 and 30 have the same function, the following description will discuss only power comparator 14.

Figure 12:
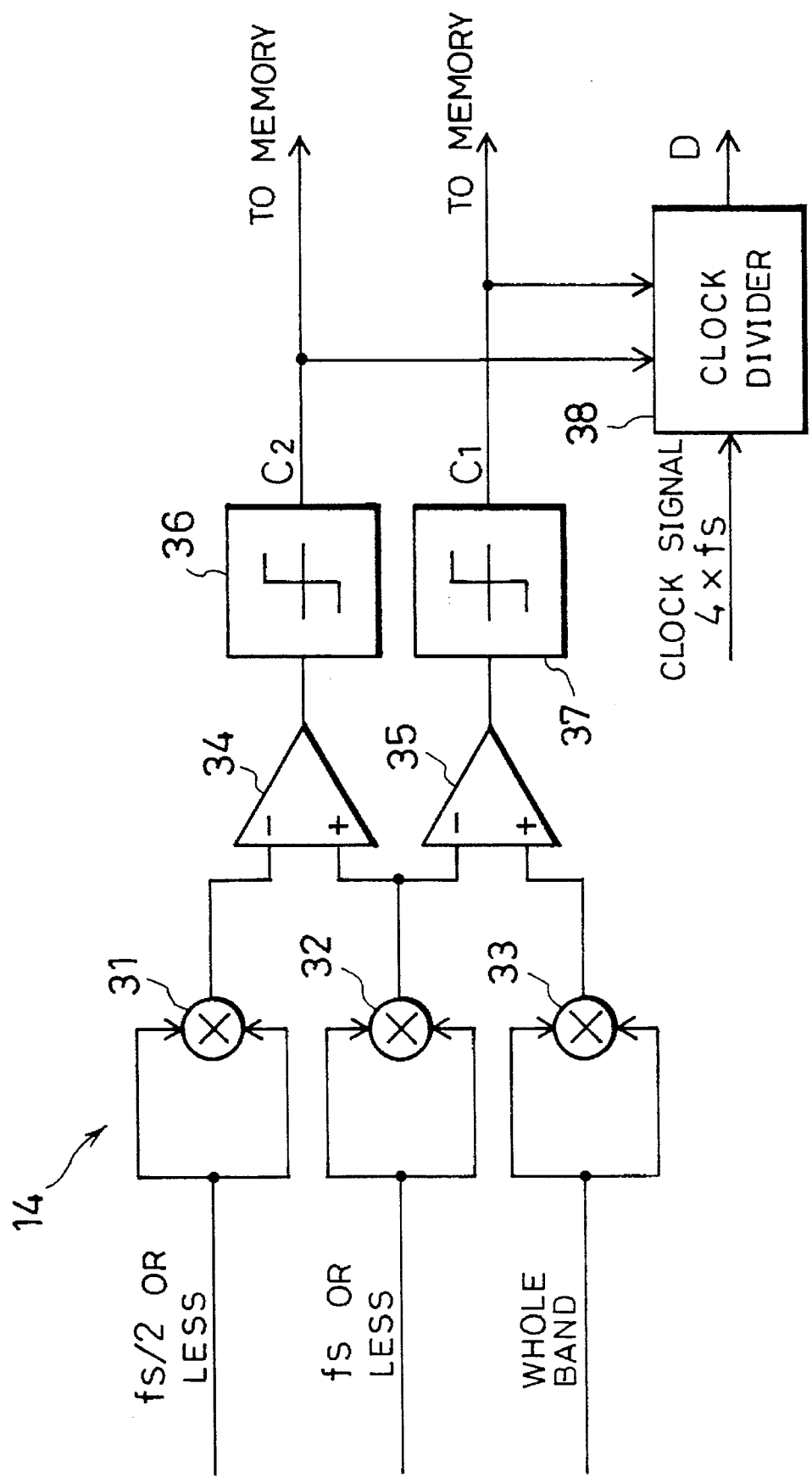
FIG. 12 is a block diagram of a power comparator in the codec apparatus according to the embodiments 1 and 2.

As shown in FIG. 12, the power comparator 14 has three multipliers 31, 32 and 33, two OP amplifiers 34 and 35, two judging units 36 and 37, and a clock divider 38. Digital signals of respective frequency bandwidths are respectively inputted to the multipliers 31, 32 and 33. The respective frequency bandwidths are $f_s/2$ or less, $f_s$ or less, and whole bandwidth.

The respective multipliers 31, 32 and 33 square the inputted digital signals so that the digital signals become positive, and output the digital signals representing power in each frequency bandwidth.

The output of the multiplier 31 is input to a minus side of the OP amplifier 34, which acts as a comparator. The output of the multiplier 32 is input to a plus side of the OP amplifier 34 and to a minus side of the OP amplifier 35. The output of the multiplier 33 is input to a plus side of the OP amplifier 35.

As a result, the OP amplifier 34 compares a signal of $f_s/2$ or less with a signal of $f_s$ or less. When the power of the signal of ($f_s/2$ or less) is smaller than the power of the signal of ($f_s$ or less), the OP amplifier 34 outputs a positive signal in proportion to the difference between both powers, and when both powers are equal, outputs a zero signal.

Meanwhile, the OP amplifier 35 compares a signal of $f_s$ or less with a signal of whole bandwidth. When the power of the signal of ($f_s$ or less) is smaller than the power of the signal of whole bandwidth, the OP amplifier 35 outputs a positive signal in proportion to the difference between both powers, and when both powers are equal, outputs a zero signal.

The output of the OP amplifier 34 is input to the judging unit 36. The judging unit 36 judges the amount of the output and outputs the judged signal as C2. In other words, when the output of OP amplifier 34 is larger than a prescribed value, the judging unit 36 outputs a signal "1" representing an "H" level, and when the output is smaller than the prescribed value, outputs a signal "0" representing an "L" level.

In contrast, the output of the OP amplifier 35 is supplied to the judging unit 37. The judging unit 37 judges the amount of the output and outputs the judged signal as C1. When the output is larger than a prescribed value, the judging unit 37 outputs the signal "1" representing the "H" level, and when the output is smaller than the prescribed value, outputs the signal "0" representing the "L" level.

Here, a signal to be outputted from the power comparator 14 to the memory 4 is represented as one signal C. However, in the case where respective three frequency bandwidths are set as mentioned above, the signal C requires two signals C2 and C1.

Figure 13:
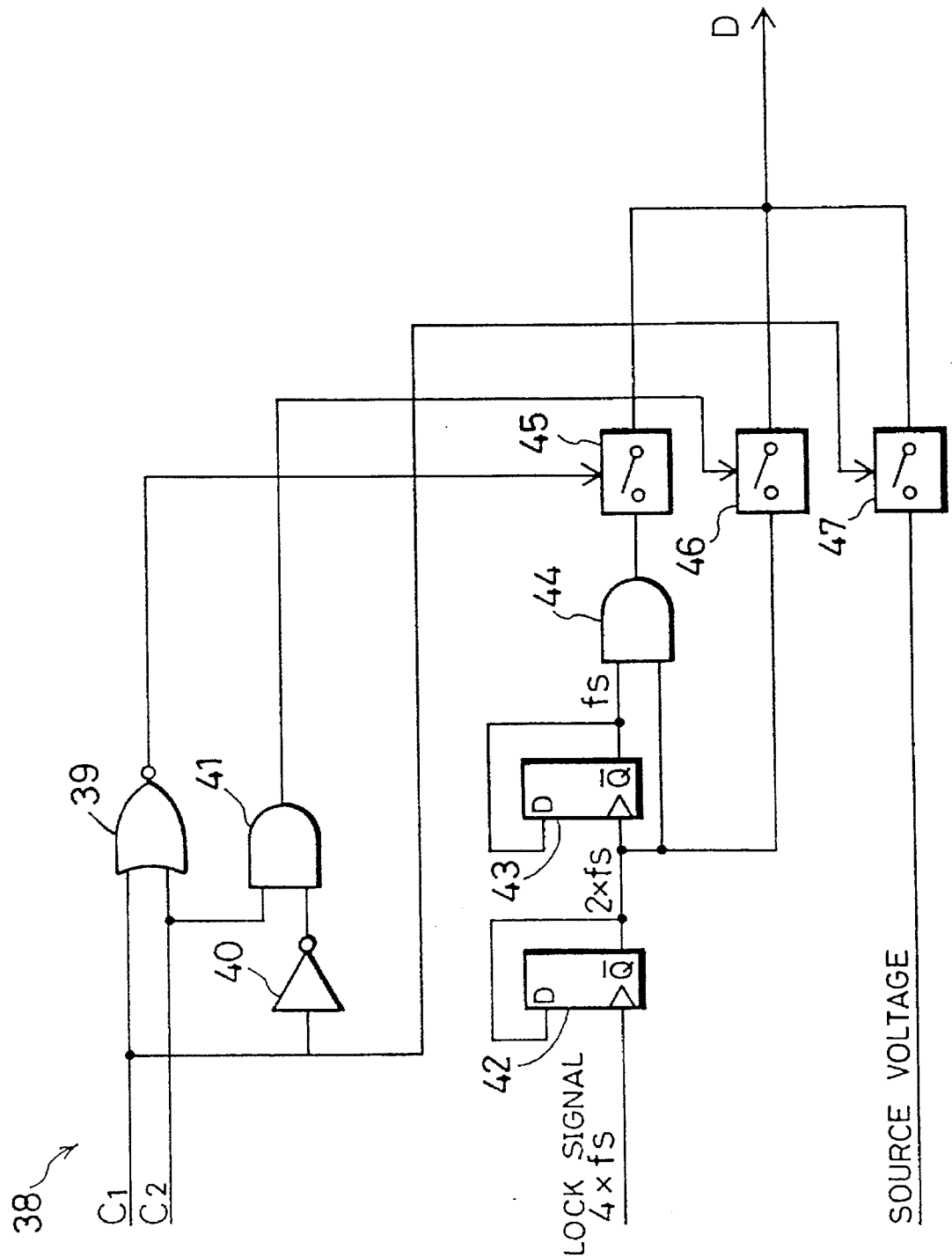
FIG. 13 is a block diagram of a clock divider in the power comparator.

The respective signals C2 and C1 are also input to the clock divider 38. The clock signal ($4\times f_s$) has been input to the clock divider 38. As shown in FIG. 13, clock divider 38 is provided with a NOR circuit 39 receiving respective signals from C2 and C1, as well as an AND circuit 41 receiving the signal C2 and a signal obtained by converting C1 by means of the inverter 40.

The clock divider 38 to which the clock signal ($4\times f_s$) (see FIG. 14(a)) is inputted is provided with a flip flop 42 for halving the clock signal to a frequency of ($2\times f_s$) (see FIG. 14(b)). In flip flop 42, the clock signal is input to a clock input of the flip flop 42, and an inversion output Q-bar in the flip flop 42 is input to a data input D in the flip flop 42.

A flip flop 43 halves the ($2\times f_s$) signal to $f_s$ (see FIG. 14(c)). The output Q-bar from flip flop 42 is input to a clock input in the flip flop 43, and an inversion output Q-bar of the flip flop 43 is input to a data input D in the flip flop 43.

An AND circuit 44 receives the inversion output Q-bars from the flip flops 42 and 43. A switch 45 receives the output of the AND circuit 44 so as to switch the output in accordance with the signal from the NOR circuit 39.

A switch 46 receives the inversion output Q-bar of the flip flop 42 so as to switch the output in accordance with the signal from the AND circuit 41. A switch 47 receives a source voltage so as to switch the source voltage in accordance with the signal from the signal C1.

The respective switches 45, 46 and 47 are set so as to be turned ON when each inputted signal is at the "H" level, and turned OFF when each inputted signal is at the "L" level. Furthermore, the source voltage represents a voltage when each signal is at the "H" level.

Next, the operation of the power comparator 14 is discussed. First, when the digital signal A obtained by digitizing the analog signal S having a frequency bandwidth of ($f_s/2$ or less) is inputted to the Fs detection circuit 6, a first signal of only $f_s/2$ or less and a second signal of only $f_s$ or less are produced from the digital signal A by the LPFs 12 and 13 of the Fs detection circuit 6.

The first signal, the second signal, and the digital signal A are supplied to power comparator The signals are respectively input to the multipliers 31, 32 and 33, and powers of the signals are detected. The powers of the first and second signals are supplied to the OP amplifier 34 for comparison.

At this time, since the original analog signal S has a frequency bandwidth of ($f_s/2$ or less), the powers substantially become equal. Therefore, since the output of the OP amplifier 34 substantially becomes zero, the judging unit 36 outputs a signal of the "L" level as signal C2. Meanwhile, the other judging unit 37 similarly outputs a signal of the "L" level as signal C1.

In this way, when both of signals C1 and C2 become the "L" level, the output of NOR circuit 39 becomes the "H"

level and the switch 45 which is controlled in accordance with that output is turned ON in the clock divider 38 where each signal has been inputted. In contrast, when both of signals C1 and C2 become the "L" level, the output of the AND circuit 41 becomes the "L" level, and the switch 46 is turned OFF. Further, since the signal C1 is also at the "L" level, the switch 47 is turned OFF.

Therefore, after being synchronized with the first transition of the clock signal, the signal D which is equal to the output of the switch 45 becomes the "H" level for one pulse of the clock signal, and becomes the "L" level for the subsequent three pulses of the clock signal. Thereafter, this cycle (see FIG. 14(e)) is repeated. Here, L shown in the drawing represents the "L" level.

In the case where the original analog signal S has a frequency bandwidth of $f_s$ or less, as shown in FIGS. 12 and 13, the output signal C1 becomes the "L" level, and the output of the signal C2 becomes the "H" level. As a result, since the output of the AND circuit 41 becomes the "H" level, only the switch 46 is turned ON.

Therefore, as shown in FIG. 14, after being synchronized with the first transition of the clock signal, the signal D which is equal to the output of the switch 46 becomes the "H" level for one pulse of the clock signal, and becomes "L" level for the following one pulse of the clock signal. Thereafter, this cycle (See FIG. 14(d)) is repeated.

In the case where the original analog signal S has a whole bandwidth, the output of the signal C1 becomes the "H" level, and the output of the signal C2 becomes the "H" level or the "L" level. As a result, since the output of the signal C1 becomes the "H" level, only the switch 47 is turned ON. Therefore, the signal D which is equal to the output of the switch 47 is always at the "H" level (see FIG. 14(f)).

With each arrangement of the above embodiments, the power comparator 14 can switch the switch 8 in synch with the clock signal, and can thin the digital signal A inputted to the Fs changing circuit 5 in synch with the clock signal.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A codec apparatus for converting an analog signal to a digital signal and decoding the digital signal to an analog signal, comprising:

converting means for converting the analog signal into a digital signal according to a first sampling frequency;

detection means for discriminating a frequency bandwidth of the analog signal; and changing means for converting a first clock signal at the first sampling frequency to a second clock signal at a second sampling frequency selected from a plurality of sampling frequencies based upon a control signal from said detection means, and for outputting the digital signal at intervals determined by the second clock signal.

2. The codec apparatus as defined in claim 1, wherein said detection means includes:

a low-pass filter to which the digital signal is inputted; and comparison means, to which a signal from said low-pass filter and the digital signal are inputted, for comparing powers of the respective signals with each other so as to detect the frequency bandwidth of the digital signal.

3. The codec apparatus as defined in claim 1, wherein said changing means includes switching means for outputting the digital signal at intervals determined by the second clock signal based upon an ON/OFF switching operation, the ON/OFF switching of the switching means occurring at the second sampling frequency.

4. The codec apparatus as defined in claim 3, further comprising:

an encoding circuit for creating encoded data from the digital signal output by said switching means; and storage means for storing the encoded data.

5. The codec apparatus as defined in claim 4, wherein the encoding circuit compresses the digital signal to create the encoded data to be stored in said storage means.

6. The codec apparatus as defined in claim 1, wherein said plurality of sampling frequencies includes the first sampling frequency.

7. A codec apparatus comprising:

an A-D converter for converting an inputted analog signal to a digital signal at a first sampling frequency and outputting the digital signal;

detection means for receiving the digital signal and for detecting a frequency bandwidth of the digital signal; and changing means, to which the digital signal and a control signal from said detection means are inputted, for converting a first clock signal at the first sampling frequency into a second clock signal at a second sampling frequency, selected from a plurality of sampling frequencies, based upon the control signal, and for outputting the digital signal at intervals determined by the second clock signal.

8. The codec apparatus as defined in claim 7, further comprising:

storage means for storing the digital signal from said changing means.

9. The code apparatus as defined in claim 8, wherein said storage means includes a storage region in which data representing the sampling frequency of the digital signal are stored.

10. The codec apparatus as defined in claim 9, wherein said storage region is set so that the data representing the sampling frequency of a respective digital signal are stored together with that digital signal.

11. The codec apparatus as defined in claim 9, wherein said storage region is set so that first data representing a sampling frequency of a digital signal group are stored separately from each digital signal in the group.

12. The codec apparatus as defined in claim 11, wherein said storage means further stores second data representing the number of digital signals in a digital signal group having the same sampling frequency.

13. The codec apparatus as defined in claim 12, further comprising:

an encoding circuit for encoding the digital signal prior to storage by said storage means.

14. The codec apparatus as defined in claim 13, wherein said encoding circuit compresses the digital signal so as to form encoded data to be stored by said storage means.

15. The codec apparatus as defined in claim 12, wherein the second data is received by said storage means from said changing means.

16. The codec apparatus as defined in claim 8, further comprising an encoding circuit for creating encoded data from the digital signal from said changing means, the encoded data being stored by said storage means.

17. The codec apparatus as defined in claim 16, wherein said encoding circuit compresses the digital signal to create the encoded data to be stored in said storage means.

18. The codec apparatus as defined in claim 7, wherein said plurality of sampling frequencies includes the first sampling frequency.

19. A codec apparatus for converting an analog signal to a digital signal and for decoding the digital signal to an analog signal, comprising:
   conversion means for converting an inputted analog signal to a first digital signal at an over-sampling frequency;
   output means for receiving the first digital signal and for outputting a second digital signal at intervals determined by a clock signal at a second sampling frequency; and
   control means for detecting a frequency bandwidth of the analog signal included in the first digital signal, and for converting a first clock signal at the over-sampling frequency into the clock signal at the second sampling frequency such that the second sampling frequency corresponds to the detected frequency bandwidth.

20. The codec apparatus as defined in claim 19, wherein said control means includes:
   a low-pass filter to which the first digital signal is inputted; and
   comparison means, to which a signal from the low-pass filter and the first digital signal are inputted, for comparing the signals with each other so as to detect the frequency bandwidth of the first digital signal.

21. The codec apparatus as defined in claim 19, wherein:
   said conversion means includes a decimation filter for converting the over-sampling frequency to the second sampling frequency; and
   said decimation filter controls the sampling frequency in accordance with a control signal from the control means.

22. The codec apparatus as defined in claim 21, wherein said decimation filter includes switching means for changing an inputted first digital signal to the second digital signal by selectively outputting the first digital signal at predetermined periods according to the second sampling frequency based upon the control signal from said control means.

23. The codec apparatus as defined in claim 21, wherein said decimation filter includes first and second converters for successively converting the over-sampling frequency to the second sampling frequency;
   an output of said first converter being inputted to said second converter and to said control means, and the sampling frequency being controlled by said second converter in accordance with the control signal from said control means.

24. The codec apparatus as defined in claim 23, wherein said second converter includes switching means for changing an inputted first digital signal to the second digital signal by selectively outputting the first digital signal at predetermined periods according to the second sampling frequency based upon the control signal from said control means.

25. The codec apparatus as defined in claim 19, further including:
   a memory for storing a group of the second digital signals produced by said conversion means, and for storing first data representing the sampling frequency of the entire group.

26. The codec apparatus as defined in claim 19, wherein the second sampling frequency is equal to or slower than the first sampling frequency.

27. The codec apparatus as defined in claim 26, wherein said first data is stored separately from the group of second digital signals.

28. The codec apparatus as defined in claim 19, further comprising:
   an encoding circuit for creating encoded data from the second digital signal output by said conversion means; and
   storage means for storing the encoded data.

29. The codec apparatus as defined in claim 28, wherein the encoding circuit compresses the second digital signal in order to create the encoded data.

30. An apparatus for digitizing an analog signal, comprising:
   a first circuit for sampling the analog signal at a first sampling frequency to produce a first digital signal;
   a bandwidth detection circuit for detecting the bandwidth of the analog signal, said bandwidth detection circuit including,
      a frequency bandwidth extractor for extracting at least first and second frequency bandwidths from the first digital signal, the first frequency bandwidth differing from the second frequency bandwidth,
      a first power determining circuit for comparing the power in the first frequency bandwidth to the power in the second frequency bandwidth, and
      a second power determining circuit for comparing the power in the second frequency bandwidth to the power in the whole bandwidth of the first digital signal;
   a clock circuit for converting a first clock signal at the first sampling frequency to a second clock signal at a second sampling frequency based upon the comparisons of said first and second power determining circuits; and
   a second circuit for producing a second digital signal derived from the first digital signal output at intervals determined by the second clock signal.

31. The apparatus of claim 30, further including:
   a memory for storing a group of the second digital signals produced by said second circuit, and for storing first data representing the sampling frequency of the entire group.

32. The apparatus of claim 31, wherein said first data is stored separately from the group of second digital signals.

33. The apparatus of claim 31, wherein said first data is received by said memory from the first and second power determining circuits.

34. An apparatus for digitizing an analog signal, comprising:
   a first circuit for sampling the analog signal at a first sampling frequency to produce a first digital signal;
   a bandwidth detection circuit for detecting the bandwidth of the analog signal;
   a clock circuit, responsive to the bandwidth of the analog signal detected by said bandwidth detection circuit, for converting a first clock signal at the first sampling frequency to a second clock signal at a second sampling frequency, the second sampling frequency being selected from a plurality of sampling frequencies; and
   a switch, responsive to the second clock signal, for receiving the first digital signal and for outputting the first digital signal at intervals determined by the second clock signal.

35. The apparatus of claim 34, wherein the plurality of sampling frequencies includes the first sampling frequency.

36. An apparatus for digitizing an analog signal, comprising:
   a first circuit for sampling the analog signal at a first sampling frequency to produce a first digital signal;

a bandwidth detection circuit for detecting the bandwidth of the analog signal;

a clock circuit, responsive to the bandwidth of the analog signal detected by said bandwidth detection circuit, for producing a clock signal corresponding to a second sampling frequency, the second sampling frequency being selected from a plurality of sampling frequencies;

a switch, responsive to the clock signal, for receiving the first digital signal and for outputting the first digital signal at intervals determined by the clock signal, wherein the first sampling frequency has a first half-period and a second half-period, the first half-period being equal to the second half-period, and further wherein the clock signal at the second sampling frequency includes a first pulse of equal duration as the first half-period of the first sampling frequency.

* * * * *